United States Patent
Nakagawa et al.

[19]

[11] Patent Number: 6,002,146
[45] Date of Patent: Dec. 14, 1999

[54] SOLID-STATE IMAGE SENSING DEVICE, METHOD FOR DRIVING THEREOF AND CAMERA EMPLOYING THE SAME

[75] Inventors: Shinji Nakagawa; Tomio Ishigami, both of Kanagawa, Japan

[73] Assignee: Sony Corporation, Tokyo, Japan

[21] Appl. No.: 08/818,738

[22] Filed: Mar. 14, 1997

[30] Foreign Application Priority Data

Mar. 14, 1996 [JP] Japan ............................ P08-057301

[51] Int. Cl.[6] .................... H01L 27/148; H01L 29/768
[52] U.S. Cl. .................. 257/231; 257/232; 257/233; 257/241
[58] Field of Search ................... 257/231–233, 257/241

[56] References Cited

U.S. PATENT DOCUMENTS

| | | | |
|---|---|---|---|
| 4,635,122 | 1/1987 | Kato et al. | 257/231 |
| 4,807,037 | 2/1989 | Iesaka et al. | 358/213.31 |
| 5,164,807 | 11/1992 | Theuwissen | 257/231 |
| 5,216,489 | 6/1993 | Yonemoto et al. | 257/231 |
| 5,283,450 | 2/1994 | Harada | 257/233 |

FOREIGN PATENT DOCUMENTS

| | | |
|---|---|---|
| 0 333 260 A1 | 9/1989 | European Pat. Off. . |
| 0 444 696 A2 | 9/1991 | European Pat. Off. . |
| 0 593 922 A1 | 4/1994 | European Pat. Off. . |

*Primary Examiner*—William Mintel

[57] ABSTRACT

A CCD area sensor comprising two horizontal transfer registers and a charge discharging section comprising a sweep-out electrode adjacent to the side of a horizontal register opposite to an image section and drain section, wherein the horizontal transfer register has a multi-channel structure comprising two transfer channels and a distribution electrode.

19 Claims, 16 Drawing Sheets

PLANE PATTERN DIAGRAM OF HORIZONTAL
TARNSFER SECTION AND CHARGE DISCHARGING SECTION

TIMING CHART FOR DISTRIBUTION OF SIGNAL CHARGE

DIAGRAM FOR OPERATIONAL DESCRIPTION OF
SIGNAL CHARGE DISTRIBUTION

DIAGRAM FOR OPERATIONAL DESCRIPTION OF SWEEPING OUT OF SIGNAL CHARGE

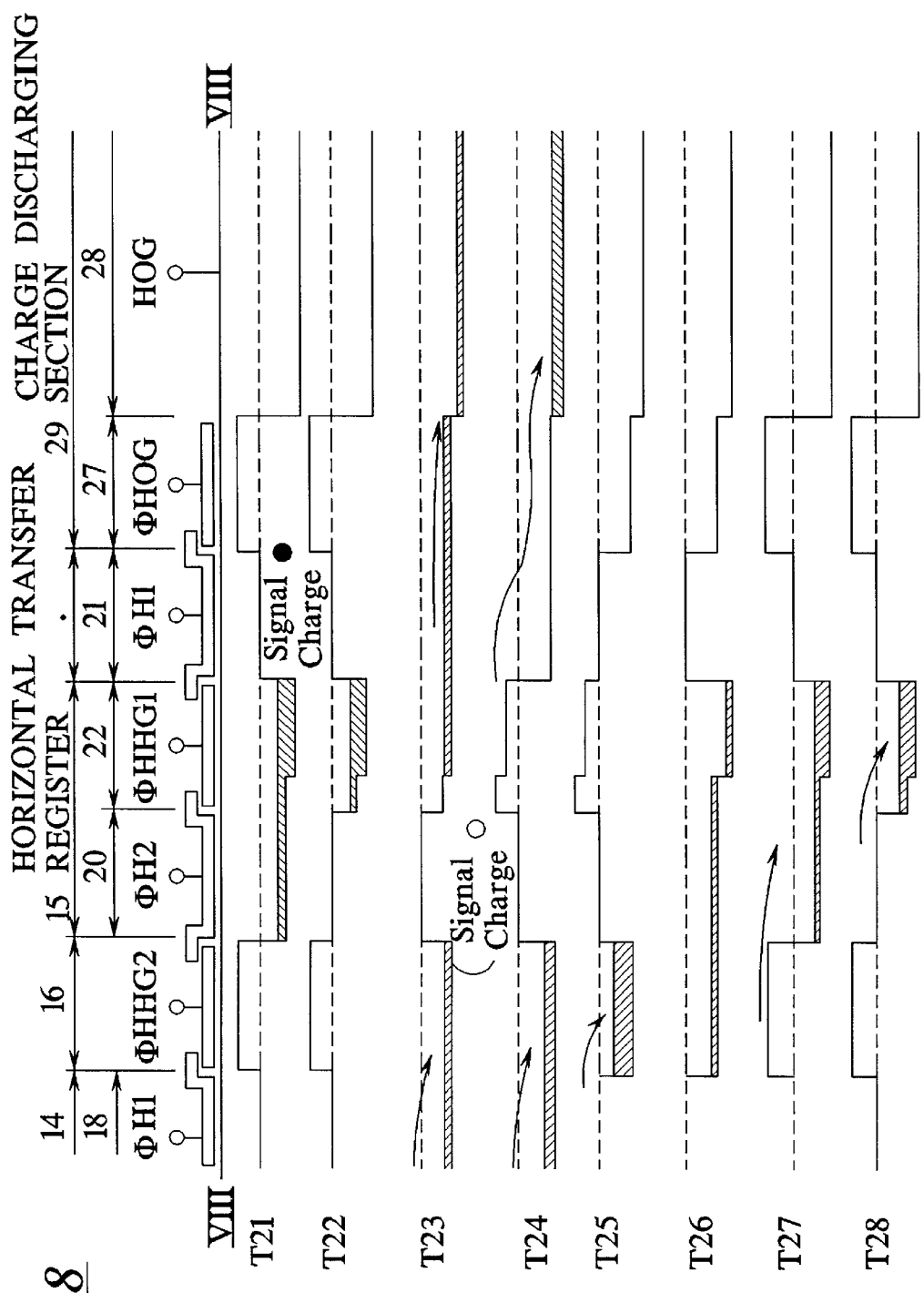

FIG. 9A
(A) NORMAL IMAGE SENSING
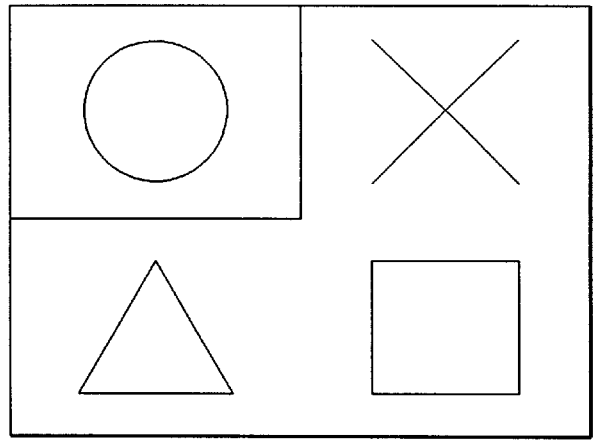
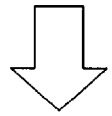
(B) HIGHT-SPEED IMAGE SENSING
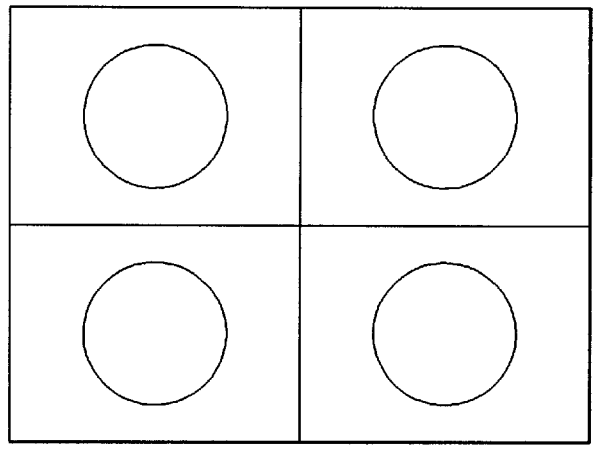
DIAGRAM OF SENSED IMAGES INVOLVING APPLICATION EXAMPLE OF THE PRESENT INVENTION
FIG. 9B OPERATIONAL IMAGE DIAGRAM (NO. 1) OF THE
APPLICATION EXAMPLE OF THE PRESENT INVENTION OPERATIONAL IMAGE DIAGRAM (NO. 1) OF THE
APPLICATION EXAMPLE OF THE PRESENT INVENTION OPERATIONAL IMAGE DIAGRAM (NO. 2) OF THE
APPLICATION EXAMPLE OF THE PRESENT INVENTION OPERATIONAL IMAGE DIAGRAM (NO. 2) OF THE
APPLICATION EXAMPLE OF THE PRESENT INVENTION

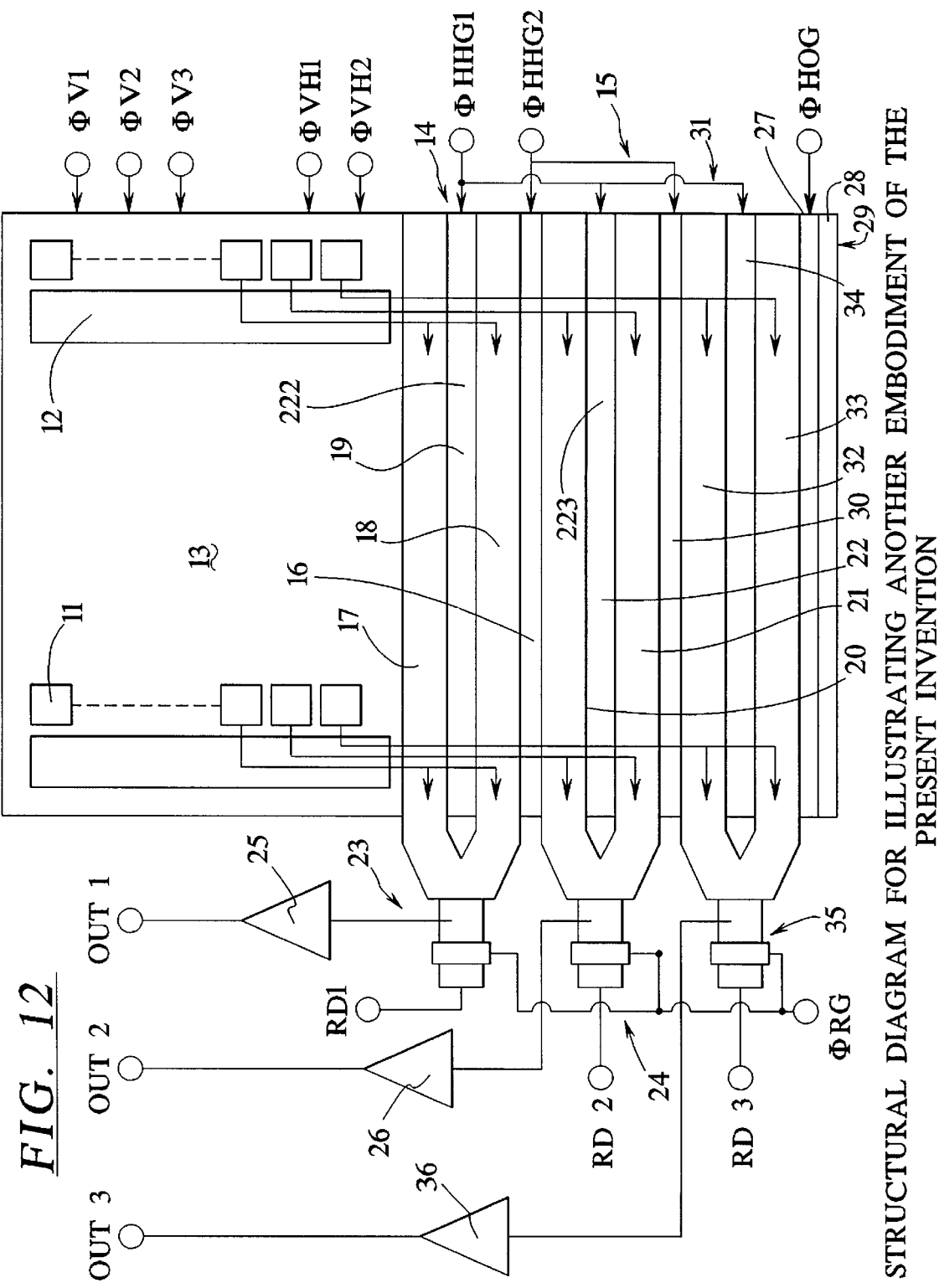

(CONVENTIONAL DEVICE)

STRUCTURAL DIAGRAM FOR ILLUSTRATING
ONE CONVENTIONAL EXAMPLE (CONVENTIONAL DEVICE)

STRUCTURAL DIAGRAM FOR ILLUSTRATING
ANOTHER CONVENTIONAL EXAMPLE

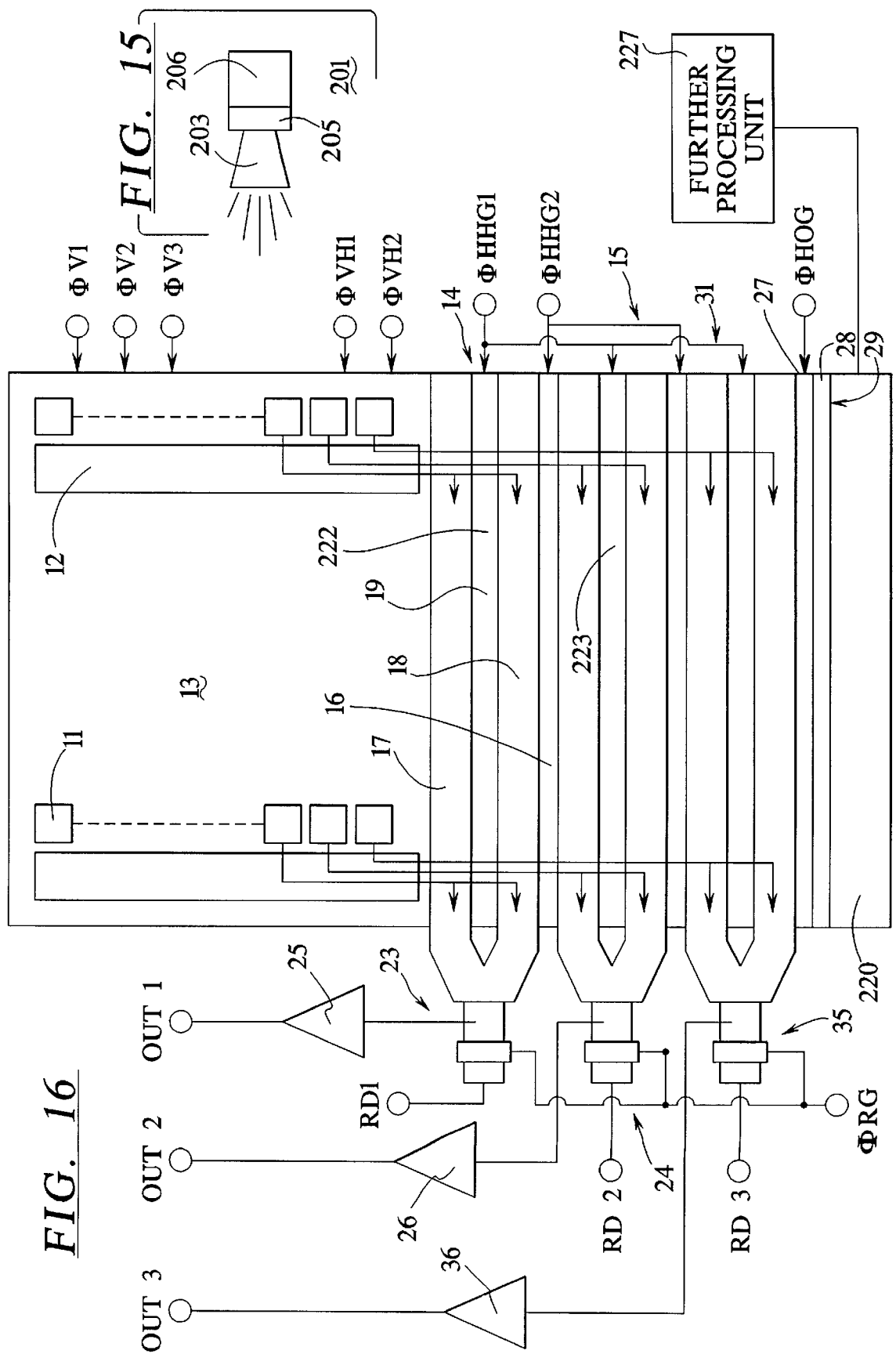

SOLID-STATE IMAGE SENSING DEVICE, METHOD FOR DRIVING THEREOF AND CAMERA EMPLOYING THE SAME

BACKGROUND OF THE INVENTION

1. Field of the Invention

The present invention relates generally to the field of solid-state image sensing devices, and more particularly, the present invention relates to an improved solid-state image sensing device and method of processing image information.

2. Description of the Related Art

Some solid-state image sensing devices, such as, for example CCD area sensors, have a structure that includes a drain section 103 for discharging signal charge and a sweep-out electrode 104 as shown in FIG. 13. These structures are provided on the side opposite an image section 101 of a horizontal transfer register 102. Application of a sweep out clock φHOG to the sweep-out electrode 104 for a given period, sweeps out the signal charges in the horizontal transfer register 102 to the drain section 103.

On the other hand, some CCD area sensors generally have a horizontal transfer register 102 with a wide channel width for increasing the capacity for involved charges because the pitch in the horizontal direction of the horizontal transfer register 102 is inevitably determined by the number of pixels and the optical system. In particular, the charge capacity of the horizontal transfer register 102 is proportional to the area per 1 bit under the condition of constant amplitude of the transfer clock, and therefore the charge capacity can be increased by increasing the length and width for one bit. However, the length is limited by the number of pixels of the image section 101 and only the channel width can therefore be increased.

In a CCD area sensor provided with a horizontal transfer register 102 with a wide channel width, if the structure for selectively sweeping out the signal charge in the horizontal transfer register 102 as described herein above is applied, it has been difficult to completely sweep out the signal charge within a predetermined time because the transfer electric field from the horizontal transfer register 102 to the drain section 103 is weak, particularly the transfer electric field at the middle portion in the width of the channel is weak when the signal charge in the horizontal transfer register 102 is intended to be swept out to the drain section 103 through the sweep-out electrode 104. In order to sweep out the signal charge in the horizontal transfer register 102, it takes a long time for sweeping out charges, and high speed sweeping out has been difficult to achieve.

This is true not only for a CCD area sensor having one horizontal transfer register 102 but also for a CCD area sensor having a structure which includes two or more horizontal transfer registers such as registers 102a and 102b shown in FIG. 14. This structure is provided with a transfer electrode 105 between both registers 102a and 102b in order to independently horizontally transfer and output the signal charge of two vertical lines for one horizontal period. A drain section 103 and sweep-out electrode 104 are provided adjacent to the outside horizontal transfer register 102b in order to selectively sweep out the signal charge in the horizontal transfer registers 102a and 102b.

As described herein above, the CCD area sensor having two horizontal transfer registers 102a and 102b can independently read the signal charge of all pixels of the image section (so-called all pixel reading) by independently reading signal charge of two vertical lines for one horizontal period. Therefore, the vertical resolution is improved in comparison with a device that reads signal charges for two vertical lines which are mixed. For a CCD area sensor of this sort, it is inevitable that the channel width of each is widened in order to increase the charge capacity of the horizontal transfer registers 102a and 102b. Thus the residual transfer of signal charge due to the decrease of the transfer electric field is a problem, as is true for a CCD area sensor having one horizontal transfer register 102.

This invention is accomplished in view of the above-mentioned problem. One object of the present invention to provide a solid-state image sensing device capable of completely sweeping out the signal charge in a horizontal transfer register and for sweeping out the signal charge to a drain section. Another object of the present invention is to provide a device which is capable of high speed sweeping out operation and a method for driving thereof. Yet another object of the present invention is to provide a device and method of processing CCD video information wherein only a portion of the complete image is initially processed at a higher speed and the remaining portion of the image is stored and later processed or processed initially at a slower speed. Other objects and advantages of the present invention will be apparent from the following summary and detailed description of the invention when viewed in light of the drawings.

SUMMARY OF THE INVENTION

A solid-state image sensing device in accordance with the present invention has a structure comprising an image section having a plurality of light receivers for photoelectrically converting incident light to signal charge. A charge transfer section has a plurality of transfer channels disposed in parallel with each other and a distribution electrode for distributing the signal charge to each of the plurality of transfer channels. The device has a multi-channel structure for transferring signal charge of a full line transferred from the image section. A charge discharging section is provided adjacent to the side of the charge transfer section opposite to the image section for selectively sweeping out signal charge in the charge transfer section.

In the method for driving a solid-state image sensing device in accordance with the present invention, signal charge is transferred from the image section to the charge transfer section one line by one line, and the signal charge of one line is distributed to a plurality of transfer channels in the charge transfer section. Then the signal charge of one line is transferred in conjunction with the plurality of transfer channels. Alternatively, the signal charge in the charge transfer section is swept out to the charge discharging section for a given period.

In the solid-state image sensing device having the structure described herein above and the method for driving thereof, the channel width of the respective channels is kept narrow even though the channel width is wide as the whole charge transfer section. This is regardless of the wide prescription of the channel width for the purpose of increasing the charge transfer capacity of the charge transfer section by providing a plurality of transfer channels to the charge transfer section. Therefore, the transfer electric field does not decrease when the signal charge is swept out from the charge transfer section to the charge discharging section, and a sufficient transfer electric field is obtained. Thus, the signal charge in the charge transfer section can be swept out to the charge discharging section completely and quickly.

Additionally, the present invention is directed to providing a solid state image sensing device which provides video information which is acceptable for use both as a digital video camera and for providing still images. The present invention satisfies these demands. The present invention achieves high speed imaging of a selected portion of an image even without changing the driving speed of the CCD.

BRIEF DESCRIPTION OF THE DRAWINGS

FIG. 8 is a potential diagram during sweep out operation of the signal charge;

FIG. 9 is a set of pick-up image diagram involving the application of the present invention; (A) is for normal pick-up and (B) is for high speed pick-up;

FIG. 12 is a structural diagram for illustrating another embodiment of the present invention;

FIG. 15 is a diagram which illustrates a camera embodying the presently claimed invention.

FIG. 16 is a diagram which illustrates a further application of the present invention.

DETAILED DESCRIPTION OF THE PRESENTLY PREFERRED EMBODIMENTS

Figure 1:
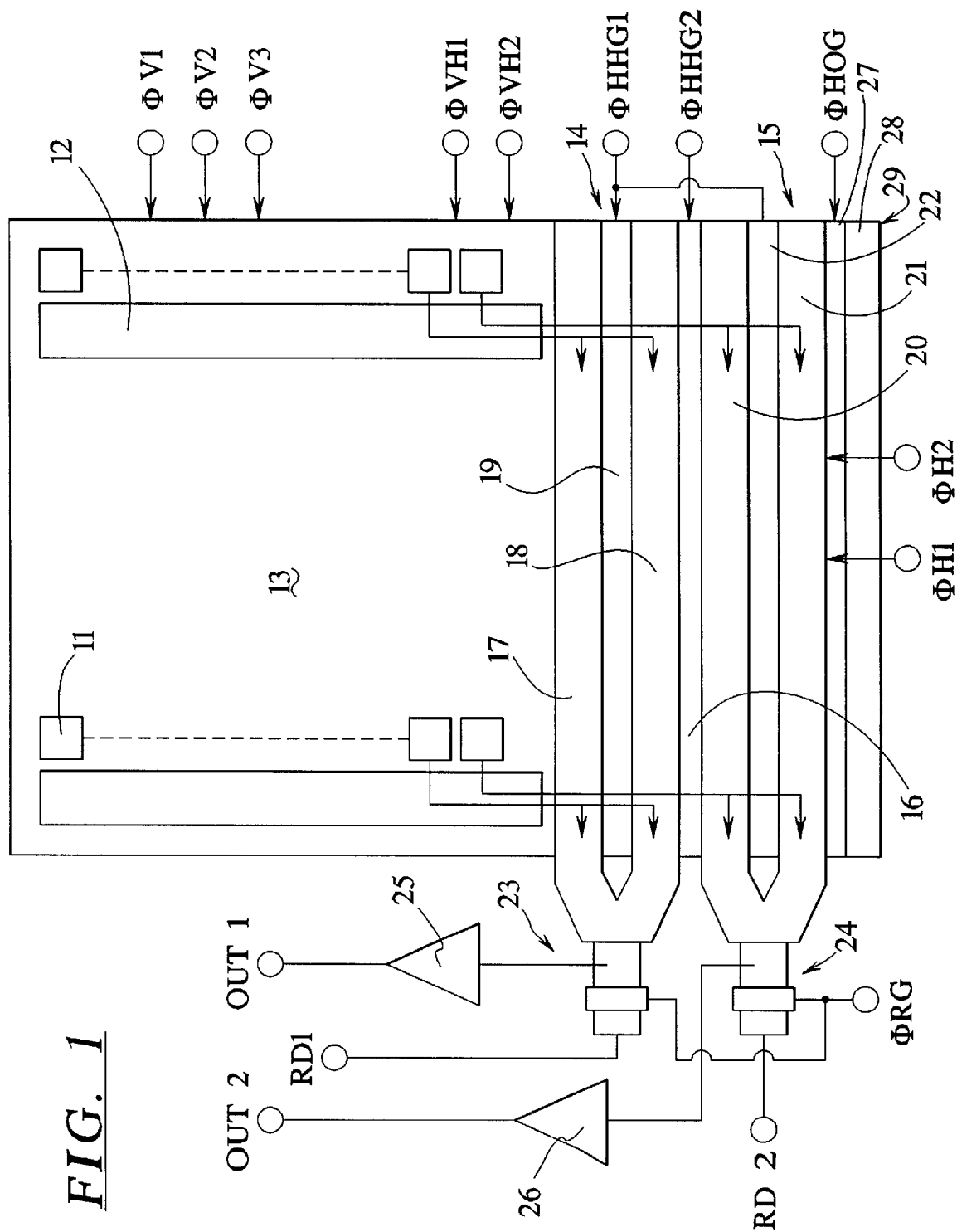
FIG. 1 is a structural diagram which illustrates one embodiment of the present invention.

Embodiments of the present invention will be described hereinafter in detail with reference to the drawings. FIG. 1 shows a structural view for illustrating one embodiment of the present invention. In this embodiment, a CCD area sensor is provided with, for example, two horizontal transfer registers for improvement of the vertical resolution.

In FIG. 1, a plurality of light receivers (pixels) 11 comprising, for example, photo-diodes are disposed in the vertical and horizontal directions in matrix arrangement for converting and storing incident light to signal charge having charge quantity corresponding to the quantity of light. Vertical transfer registers 12 are disposed for each vertical line of receiving sections 11. The vertical transfer register 12 comprises a CCD and has, for example, a three layered electrode structure. It is driven by three-phase vertical transfer clocks $\phi V1$ to $\phi V3$. Signal charges read from each receiving section 11 are transferred vertically successively shifting pixels one by one within a portion of a horizontal blanking period. This is the structure of the image section.

In the figure, under the image section 13, for example, two horizontal transfer registers 14 and 15 are provided in parallel. Between the two horizontal transfer registers 14 and 15, a transfer electrode 16 is located for transferring the signal charge from the horizontal transfer register 14 to the horizontal transfer register 15. By applying transfer clock $\phi VH1$ and UVH2 to the lower two steps (VH1 and VH2) of each vertical transfer register 12 of the image section 13, signal charge of two vertical lines (two rows) is moved from the image section 13. Two horizontal transfer registers 14 and 15 comprise CCDs which are two-phase driven using the horizontal transfer clocks UH1 and UH2. Signal charge for two lines transferred from the image section 13 is successively transferred in the horizontal direction for a horizontal scanning period after a horizontal blanking period sharing the signal charges of one line each.

The horizontal transfer register 14 comprises, for example, two transfer channels 17 and 18 disposed in parallel and a distribution electrode 19 provided between these two transfer channels 17 and 18 for distributing signal charge to each channel. The device has a multi-channel structure such that the transfer channels 17 and 18 are merged at the output. The horizontal transfer register 14 transfers the signal charge of the first one line to the horizontal transfer register 15 through the transfer electrode 16, and transfers the signal charge of the following one line to two transfer channels 17 and 18 through the distribution electrode 19. The two transfer channels 17 and 18 transfer horizontally in shared relationship and mix pixels at the merged output step one by one.

Similarly, the horizontal transfer register 15 comprises, for example, two transfer channels 20 and 21 provided in parallel and a distribution electrode 22 provided between these two transfer channels 20 and 21 for distributing signal charge to each channel. It has a multi-channel structure having the two transfer channels 20 and 21 merged at the output. The horizontal transfer register 15 distributes signal charge of one line transferred from the horizontal transfer register 14 through the transfer electrode 16 to two transfer channels 20 and 21 through the distribution electrode 22, these two transfer channels 20 and 21 transfer horizontally in sharing relationship and mix pixels at the merged output step one by one.

On the end that is the destination from the horizontal transfer registers 14 and 15, for example, charge detectors 23 and 24 having a floating diffusion amplifier (FDA) structure are provided. The charge detectors 23 and 24 detect the signal charge transferred horizontally from the horizontal transfer registers 14 and 15 and convert it to a signal voltage. These signal voltages are output through amplifiers 25 and 26 as CCD outputs OUT1 and OUT2.

On the opposite side of the outside horizontal transfer register 15 from the image section 13, a sweep-out electrode 27 and a drain section 28 are provided adjacent each other along the transfer direction of the horizontal transfer register 15. The sweep-out electrode 27 and drain section 28 constitute a charge discharging section 29. By applying a sweep out clock $\phi HOG$ to the sweep-out electrode 27, the signal charge in the horizontal transfer register 15 and signal charge in the horizontal transfer register 14 transferred through the transfer electrode 16 and the horizontal transfer register 15 are swept out to the drain section 28.

Figure 2:
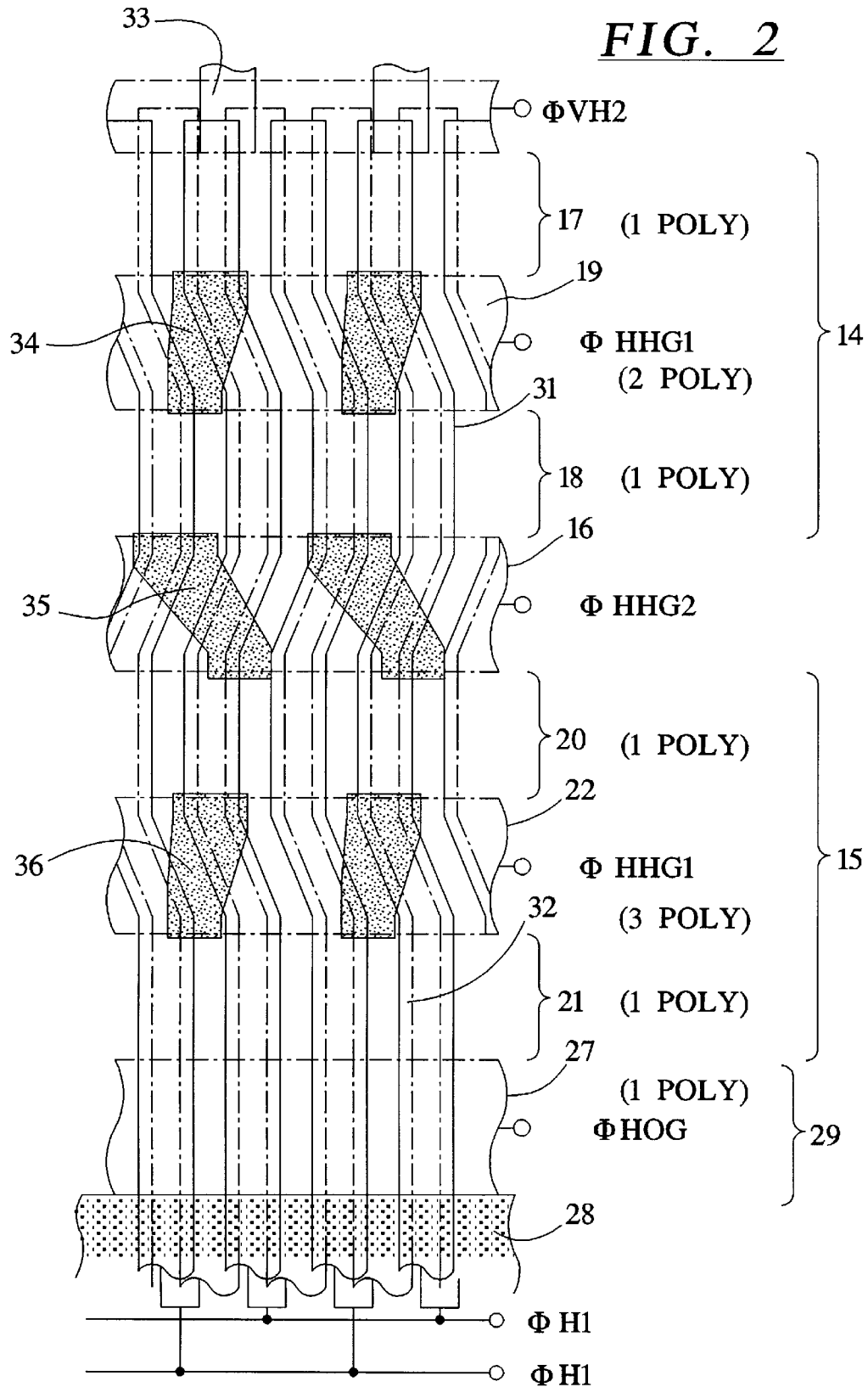
FIG. 2 is a plan pattern diagram of a selected portion of a horizontal transfer section and charge discharging section.

In FIG. 2, a plan pattern of a selected portion of the horizontal transfer section and charge discharging section 29 is shown. In the figure, the transfer electrode 16 and respective distribution electrodes 19 and 22 of the horizontal transfer registers 14 and 15 are respectively formed of the first polysilicon layer (1poly). In the horizontal transfer registers 14 and 15, a storage electrode 31 is formed of the second polysilicon layer (2poly), and a transfer electrode 32 is formed of the third polysilicon layer (3poly). The storage electrode 31 and transfer electrode 32 which are disposed adjacent each other in the transferring direction forms a pair. A combination of two pairs corresponds to one pixel of the image section 13, and constitutes one bit.

In the horizontal transfer section having such structure, the storage electrode 27 and transfer electrode 28 which form a pair is driven by application of the horizontal transfer clock φH1 and φH2 in every other bit. Respective distribution electrodes 19 and 22 of the horizontal transfer registers 14 and 15 are electrically connected to each other, and are driven by the same distribution clock φHHG1. The transfer electrode 16 is driven by the transfer clock φHHG2. Half-tone dot meshing zones 33 to 36 in FIG. 2 are channel stop sections.

On the other hand, in the charge discharging section 29, the sweep-out electrode 27 is also formed of the first polysilicon layer (1poly) like the transfer electrode 16 of the horizontal transfer section and respective distribution electrodes 19 and 22 of the horizontal transfer registers 14 and 15. The sweep-out electrode 27 is driven by the sweep out clock φHOG. For the sweep out clock φHOG, in the exemplary embodiment, a clock with the same phase as of the transfer clock φHHG2 is used. The storage electrode 27 and transfer electrode 28 of the horizontal transfer section are formed extending to the portion of the drain section 28 as is obvious from FIG. 2.

Next, operation of CCD area sensor provided with two horizontal transfer registers 14 and 15 having multi-channel structure as described herein above is described. In this CCD area sensor, signal charge of two vertical lines is provided from the image section 13 to the horizontal transfer registers 14 and 15 for one horizontal period because two horizontal transfer registers 14 and 15 are provided.

Figure 3:
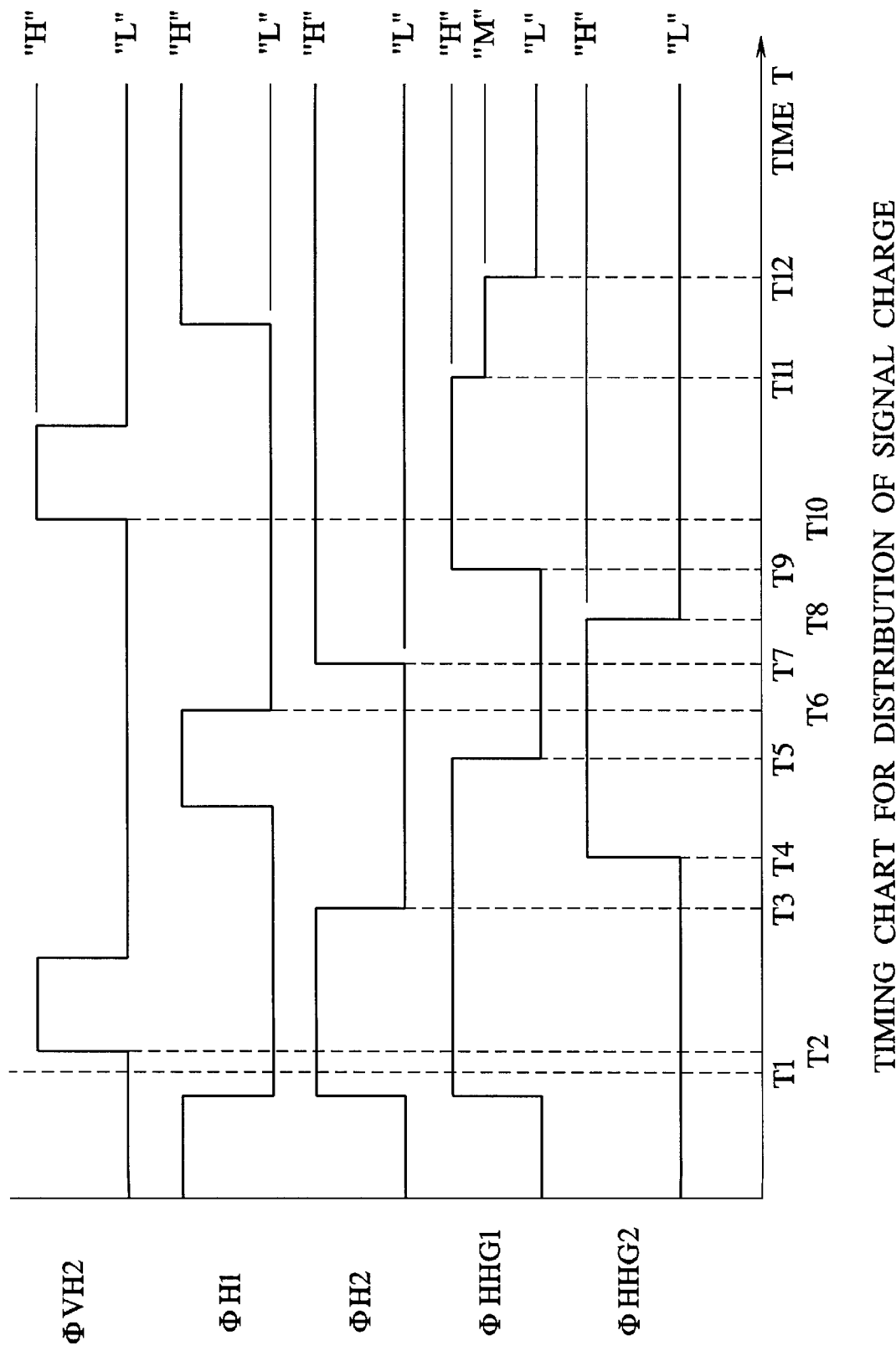
FIG. 3 is a timing chart illustrating operation of signal charge transfer;.
Figure 4:
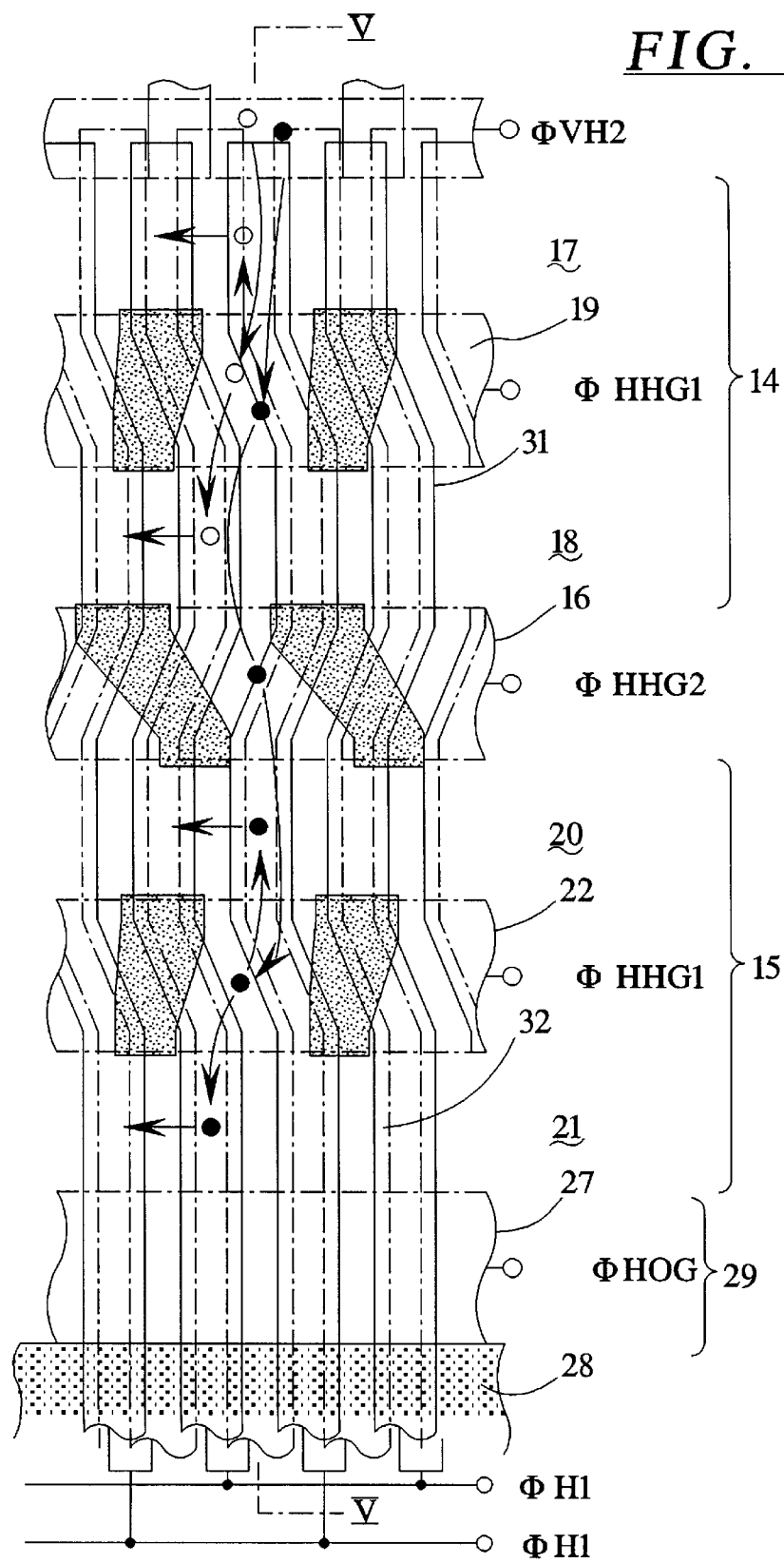
FIG. 4 is a diagram which illustrates operation of signal charge distribution.
Figure 5:
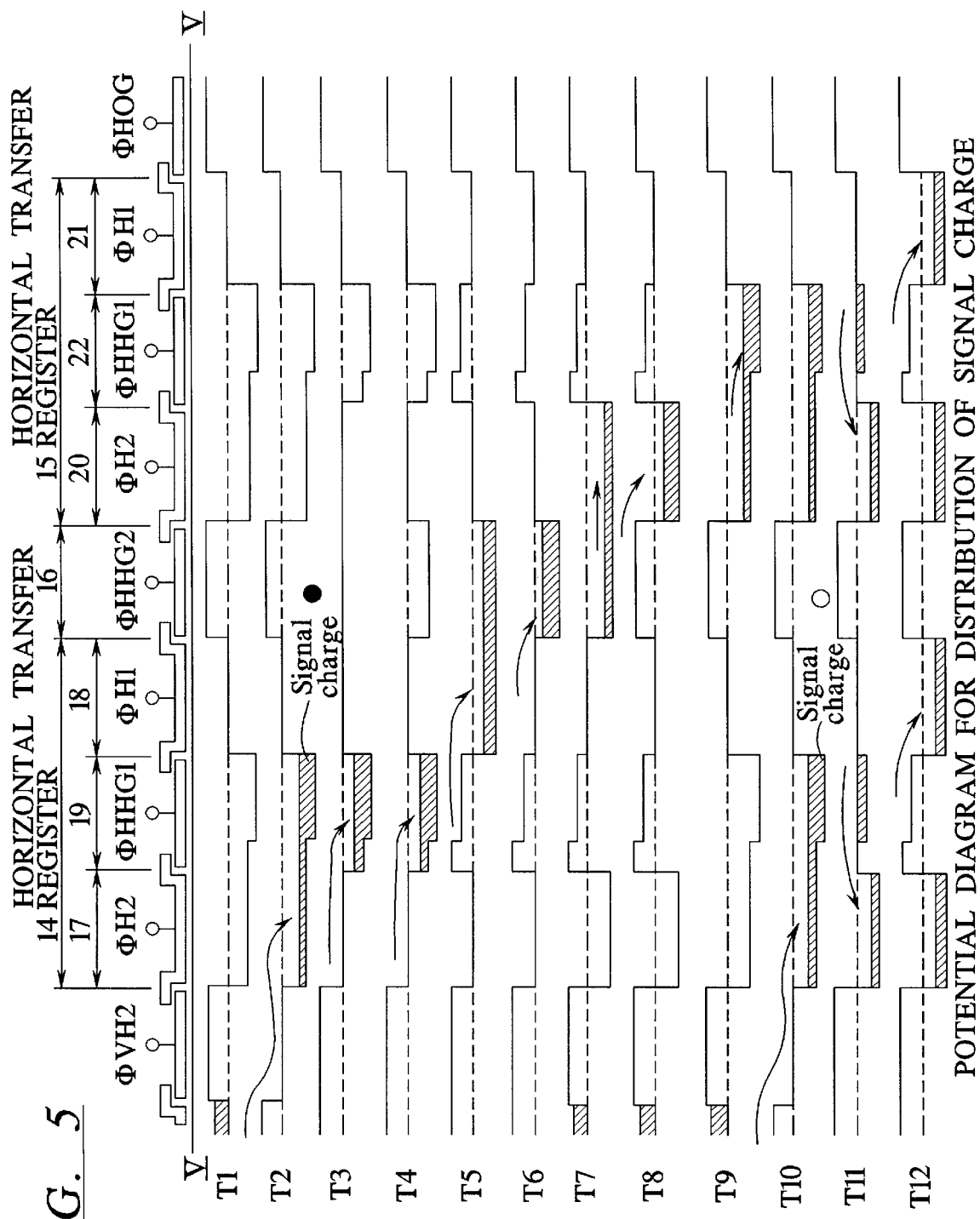
FIG. 5 is a potential diagram during distribution operation of the signal charge.

First, the operation for distributing signal charge to each transfer channel of the horizontal transfer registers 14 and 15 having multi-channel structure is described based on a timing chart shown in FIG. 3 referring to the operational description diagram shown in FIG. 4 and the potential diagram in FIG. 5. FIG. 5 is a potential diagram along the line A–A' in FIG. 4.

As the transfer clock φ VH2 applied to the gate electrode on the first line rises to a high level (abbreviated as "H" level hereinafter) during the period from the time point T1 to the time point T2, the potential under it is deepened. The signal charge (● marked in FIG. 4) on the first line of the image section 13 is transferred to the horizontal transfer register 14. Synchronously with this transfer, every signal charge on lines subsequent to the second line are shifted one line by one line in order, and thus the signal charge on the second line (○ marked in FIG. 4) is transferred to the pixel train of the first line.

When, the potential of the transfer channels 18 and 21 is shallow because both horizontal transfer clock φH2 and distribution clock φHHG1 are at "H" level, the potential of the respective transfer channels 17 and 20 of the horizontal transfer registers 14 and 15 and the potential under the respective distribution electrodes 19 and 22 is therefore deep. The horizontal transfer clock H1 is in a low level (abbreviated as "L" level hereinafter). Therefore, the signal charge ● of the first line transferred from the image section 13 to the horizontal transfer register 14 is stored in the transfer channel 17 under distribution electrode 19.

Subsequently, after the transfer clock φVH2 changes to "L" level, the horizontal transfer clock φH2 changes to "L" level, and the potential of the transfer channel 17 becomes shallow (time point T3). Then the signal charge in the transfer channel 17 is transferred under the distribution electrode 19. Thereby, all the signal charges ● transferred from the pixel train on the first line of the image section 13 are stored under the distribution electrode 19. Subsequently, when the transfer clock φHHG2 becomes "H" level (time point T4), the potential under the transfer electrode 16 becomes deep.

Afterward, the signal charge ● stored under the distribution electrode 19 is transferred to the transfer channel 18 under the transfer electrode 16, because when the horizontal transfer clock φH1 changes to "H" level, and subsequently the distribution clock φHHG1 changes to "L" level (time point T5), the potential of the transfer channel 18 becomes deep and the potential under the distribution electrode 19 becomes shallow. Then, when the horizontal transfer clock φH1 changes to "L" level and the potential of the transfer channel 18 becomes shallow (time point T6), the signal charge in the transfer channel 18 is transferred under the transfer electrode 16, and all the signal charges ● for a complete one pixel is stored therein.

Next, when the horizontal transfer clock φH2 changes to "H" level and the potential of the transfer channel 20 of the horizontal transfer register 15 becomes deep (time point T7), the signal charge ● stored under the transfer electrode 16 disperses from the under transfer electrode 16 to the transfer channel 20. Then, when the transfer clock φHHG2 becomes "L" level and the potential under the transfer electrode 16 becomes shallow (time point T8), all the signal charges under the transfer electrode 16 are transferred to the transfer channel 20, all the signal charges ● for full one pixel are stored in the transfer channel 20.

Subsequently, when the distribution clock φHHG1 changes to "H" level (time point T9), the potential under the respective distribution electrodes 19 and 22 of the horizontal transfer registers 14 and 15 becomes deep. Thereby, the signal charge ● stored in the transfer channel 20 of the horizontal transfer register 15 disperses under the distribution electrode 22. Next, when the transfer clock φVH2 applied to the gate electrode of the first line changes to "H" level and the potential under the gate electrode becomes deep (time point 10), the signal charge of the first line of the image section 13 (because this signal charge was the signal charge of the second line, this signal charge is referred to as signal charge of the second line ○) is transferred to the horizontal transfer register 14.

When both the horizontal transfer clock φH2 and distribution clock φHHG1 are in "H" level, the potential of respective transfer channels 17 and 20 of the horizontal transfer registers 14 and 15 and the potential under the respective distribution electrode 19 and 22 is deep, and the horizontal transfer clock φH1 is in "L" level, the potential of the transfer channels 18 and 21 is therefore shallow. Thus, the signal charge ○ of the second line transferred from the image section 13 to the horizontal transfer register 14 is stored in the transfer channel 17 under the distribution electrode 19.

Next, after the transfer clock φVH2 changes to "L" level and the distribution clock φHH1 changes to the intermediate level (referred to as "M" level hereinafter) (time pint T11), the potential under the respective distribution electrodes 19 and 22 of the horizontal transfer registers 14 and 15 becomes an intermediate level. The signal charge which exceeds the storing capacity and overflows is returned to the transfer channels 17 and 20. Subsequently, the horizontal transfer clock φH1 changes to "H" level, and afterward the distribution clock φHHG1 changes to "L" level (time point T12), and the signal charge remaining under the distribution electrodes 19 and 22 is transferred to the transfer channels 18 and 21.

Through the one series of operations described herein above, the signal charge ● ○ of two vertical full two lines is transferred from the image section 13 to two horizontal transfer registers 14 and 15. In the respective registers 14 and 15 the signal charge of each full one line is distributed to the transfer channel 17 and transfer channel 18, and transfer channel 20 and transfer channel 21 by the distribution electrodes 19 and 22. Because the horizontal transfer register 14 of the image section 13 side has a multi-channel structure, if the channel width of the whole horizontal transfer register 14 for the purpose of increasing the charge capacity is large, then the width of the respective transfer channels 17 and 18 is still narrow and the transfer electric field in the channel width direction is sufficient, and the signal charge of a full one line is transferred from the horizontal transfer register 14 to the horizontal transfer register 15 completely and quickly.

The distributed signal charge is two-phase driven by the horizontal transfer clocks φH1 and φH2 in the horizontal transfer registers 14 and 15, and horizontally transferred in sharing with the transfer channels 17 and 18 and transfer channels 20 and 21, and then mixed in a pixel unit at the output step. The signal charge is then transferred to the charge detectors 25 and 26, converted to a signal voltage therein, and output as CCD outputs OUT1 and OUT2 for two full lines through the amplifiers 25 and 26.

Figure 6:
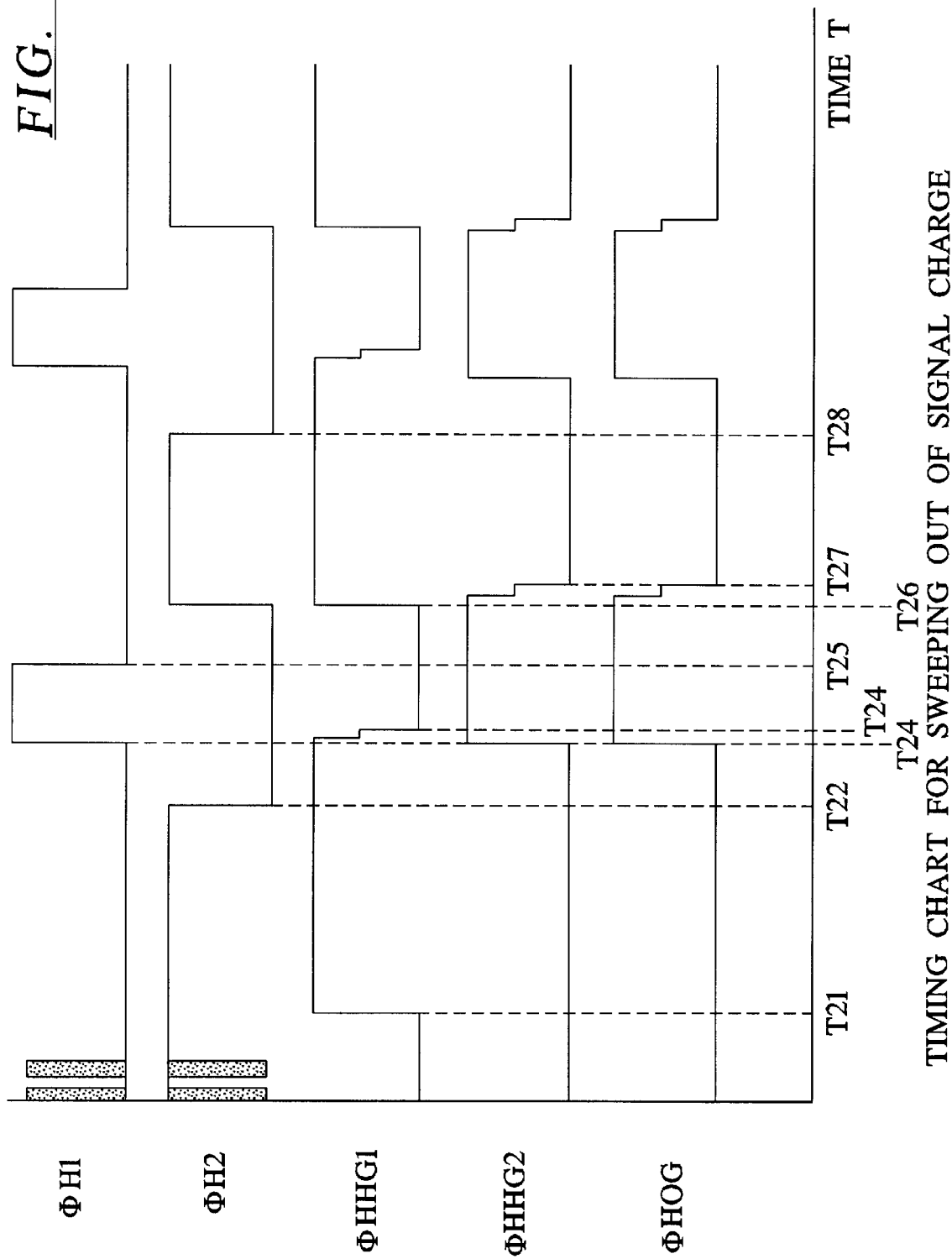
FIG. 6 is a timing chart during sweep out operation of the signal charge.
Figure 7:
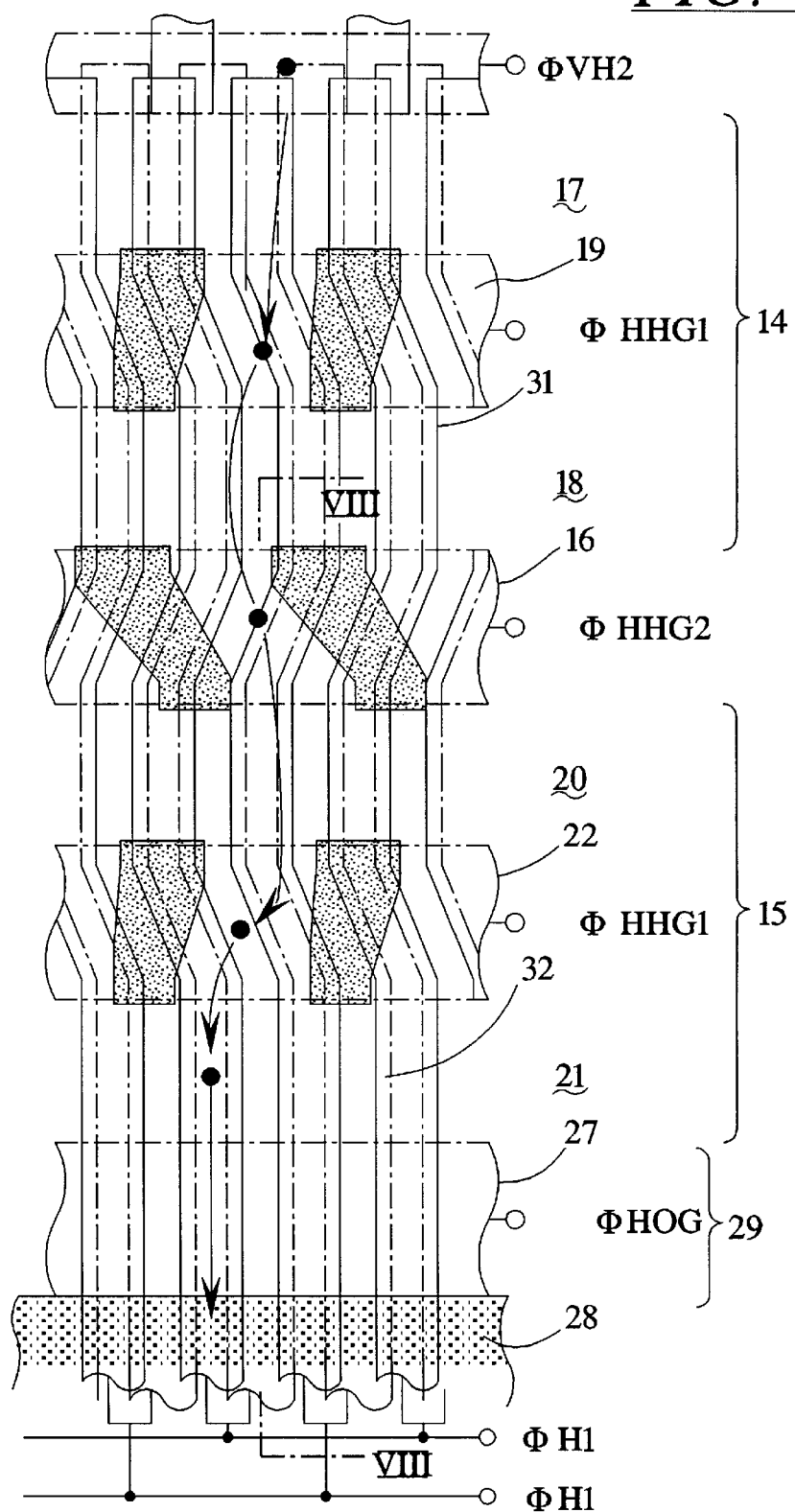
FIG. 7 is a diagram for describing the sweep out operation of the signal charge.

Next, operation for sweeping out the signal charge of two full lines of the image section 13 to the charge discharging section 29 through the horizontal transfer register 14, transfer electrode 16, and horizontal transfer register 15 is described based on the timing chart shown in FIG. 6. This is done with reference to the diagram for description of the operation shown in FIG. 7 and the potential diagram shown in FIG. 8. FIG. 8 is the potential diagram along the line B–B' in FIG. 7, namely the potential diagram from the transfer channel 18 of the horizontal transfer register 14 to the drain section 28.

The condition at the time point T21 is the same as that of the time point T9 that, in the above-mentioned distribution operation of the signal charge. The signal charge ● of the first line of the image section 13 is transferred to the horizontal transfer register 15 through the horizontal transfer register 14 and transfer electrode 16, and stored in the transfer channel 20 under the distribution electrode 22. That is, up to this point, the signal charge ● on the first one is transferred to the horizontal transfer register 15 through the horizontal transfer register 14 and transfer electrode 16 in the same way as operated in the above-mentioned distribution operation. The signal charge of the second line is transferred to the horizontal transfer register 14 and stored in the transfer channel 17 under the distribution electrode 19.

Next, when the horizontal transfer clock H2 changes to "L" level and the potential under the transfer channel 20 becomes shallow (time point 22), all the signal charge ● of the first line is stored under the distribution electrode 19.

Subsequently, when the horizontal transfer clock φH1, transfer clock φHHG2, and sweep out clock φHOG all change to "H" level and the potential of the transfer channels 18 and 21, the potential under the transfer electrode 16, and the potential under the sweep-out electrode 27 becomes deep (time point T23). Then, the signal charge ● of the first line stored under the distribution electrode 19 flows out to the drain section 28 through the transfer channel 21 under the sweep-out electrode 27. Then, the signal charge ○ of the second line stored under the distribution electrode 19 flows into the transfer channel 18 and under the transfer electrode 16.

Subsequently, when the distribution clock φHHG1 changes to "L" level and the potential under the distribution electrode 19 becomes shallow (time point T24), the signal charge ● of the first line stored under the distribution electrode 22 is completely swept out to the drain section 28, and the signal charge of the second line stored under the distribution electrode 19 is completely transferred to the transfer channel 18 and the transfer electrode 16. Then, when the horizontal transfer clock φH1 changes to "L" level and the potential of the transfer channels 18 and 21 become shallow (time point T25), the signal charge of the second line is completely stored under the transfer electrode 16.

Next, when the horizontal transfer clock φH2 and distribution clock φHHG1 change to "H" level and the potential of the transfer channels 17 and 20 and the potential under the distribution electrodes 19 and 22 becomes deep (time point T26), the signal charge ○ of the second line stored under the transfer electrode 16 flows into the transfer channel 20 of the horizontal transfer register 15 under the distribution electrode 22.

Then, when the transfer clock φHHG2 and sweep out clock φHOG change to "L" level and the potential under the transfer electrode 16 becomes shallow (time point T27), the signal charge of the second line stored under the transfer electrode 16 flows into the transfer channel 20 of the horizontal transfer register 15 under the distribution electrode 22. When the horizontal transfer clock φH2 changes to "L" level and the potential of the transfer channels 17 and 20 become shallow (time point T28), all the signal charge ○ of the second line is stored under the distribution electrode 22. This condition is the same as that at the time point T22, and after this point in time, the signal charge ○ of the second line is swept out to the drain section by repeating the same operation as that after the time point T22.

By the above-mentioned series of operations, the signal charge of each pixel of the image section 13 is swept out in a unit of a line to the drain through the horizontal transfer register 14, transfer electrode 16, horizontal transfer register 15, and sweep-out electrode 27. Because the horizontal register 14 employs a multi-channel structure as described hereinbefore, the signal charge for full one line can be completely transferred from the horizontal transfer register 14 to the horizontal transfer register 15. Further, because the horizontal register 15 employs also the multi-channel structure, if the channel width of the whole horizontal transfer register 15 is designed to be wide for the purpose of increasing the charge capacity, the channel width of the respective transfer channels 20 and 21 is still narrow and the transfer electric field in the channel width direction is sufficient. Therefore the signal charge for a full one line can be transferred completely and speedily from the horizontal transfer register 15 to the drain section 28.

By driving the sweep-out electrode 27 with the clocks (φHHG2 and φHOG) having the same phase as the transfer electrode 16 between the horizontal transfer registers 14 and 15, the sweep out operation of the signal charge from the horizontal transfer register 15 to the drain section 28 and the transfer operation of the signal charge from the horizontal transfer register 14 to the horizontal transfer register 15 are operated simultaneously. Therefore, time is saved, and the discharging operation of the signal charge in the unit of a line is possible. Only one driver is sufficient because the transfer clock φHHG2 and sweep out clock φHOG are driven with the same phase.

The operation is described referring to an example in which the signal charge of each pixel of the image section 13 is swept out to the drain section 28 in the above-mentioned operation description, however, it may be possible that after the signal charge is horizontally transferred in a certain period of time for a horizontal effective period from the horizontal transfer registers 14 and 15, then the residual signal charge in the horizontal transfer registers 14 and 15 is swept out to the drain section 28 through the same operation as that described above.

Next, an operative example of the CCD area sensor having the multi-channel structure as described herein above and provided with two horizontal transfer registers 14 and 15 will be described. This is an example where the left lower half of the image section 13 (¼ of effective pixels) is sectioned, and one picture is obtained within ¼ the usual time, thereby, driving with four times the picture rate is possible. FIG. 9 is an image diagram involving this application example, (A) shows a normal pick-up and (B) shows a high speed pick-up in which ¼ of the area (○) is sectioned.

The driving operation in this operative example is described with reference to the operation image shown in FIG. 10 and FIG. 11. In this operative example, the number of vertical lines is 15 is described. Because the pick-up image on the image section 13 is mirror symmetrical with the actual regenerated image, after the line number R is added for the lines on the left half of the effective pixel area, L is added for the lines on the right half.

Figure 10A:
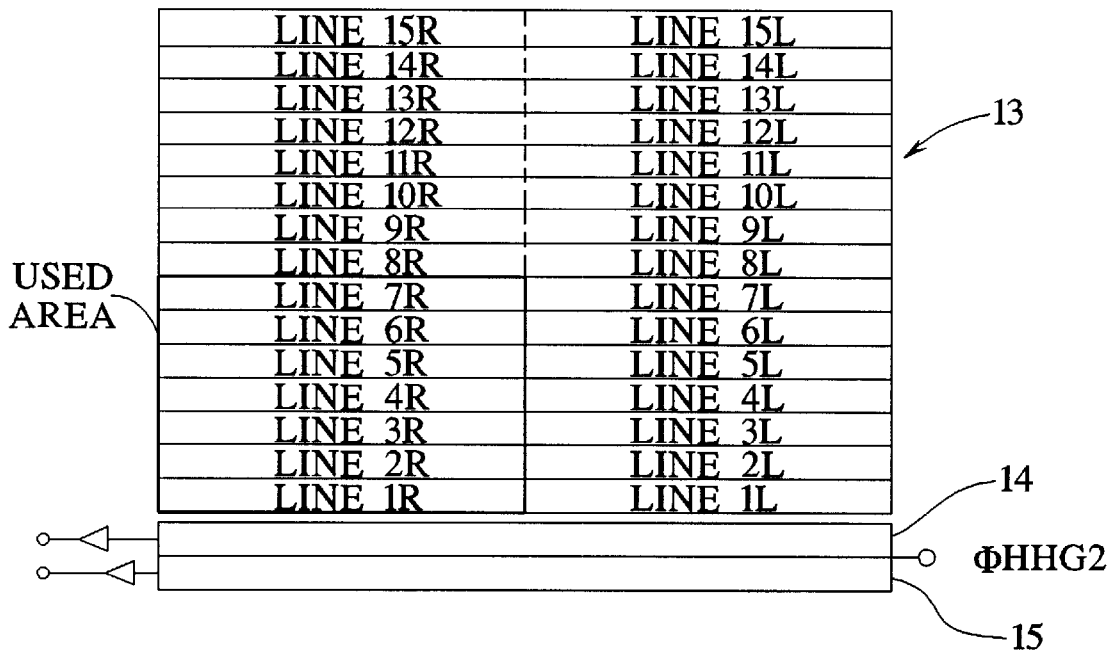
FIGS. 10A–10D are exemplary image diagrams (No. 1) for describing the driving operation of the application example of the present invention.
Figure 10C:
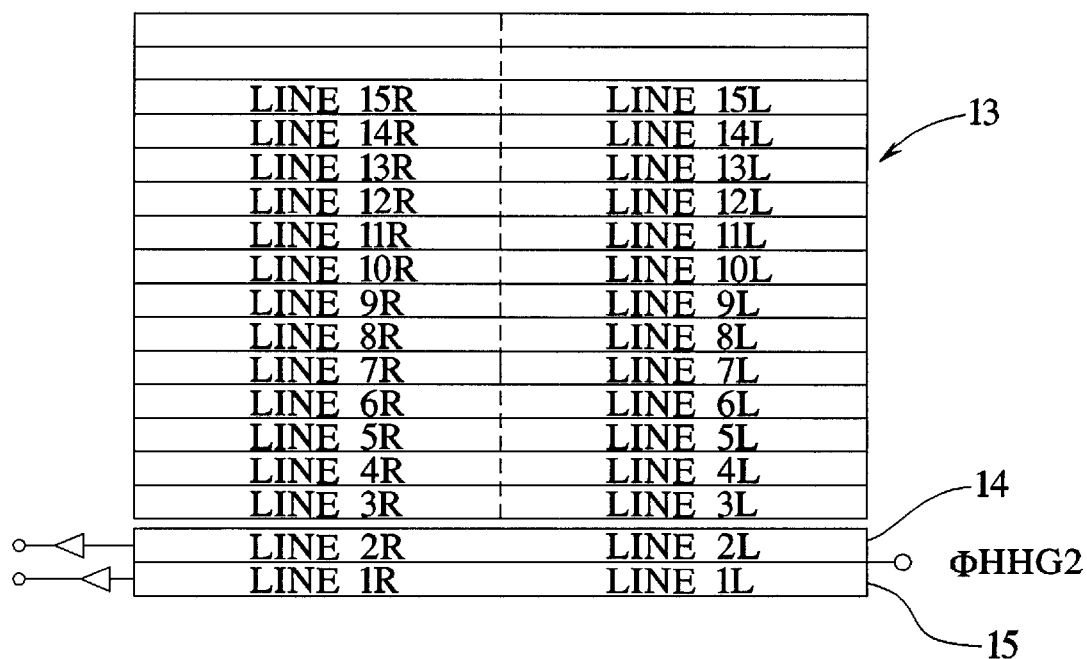
Figure 10B:
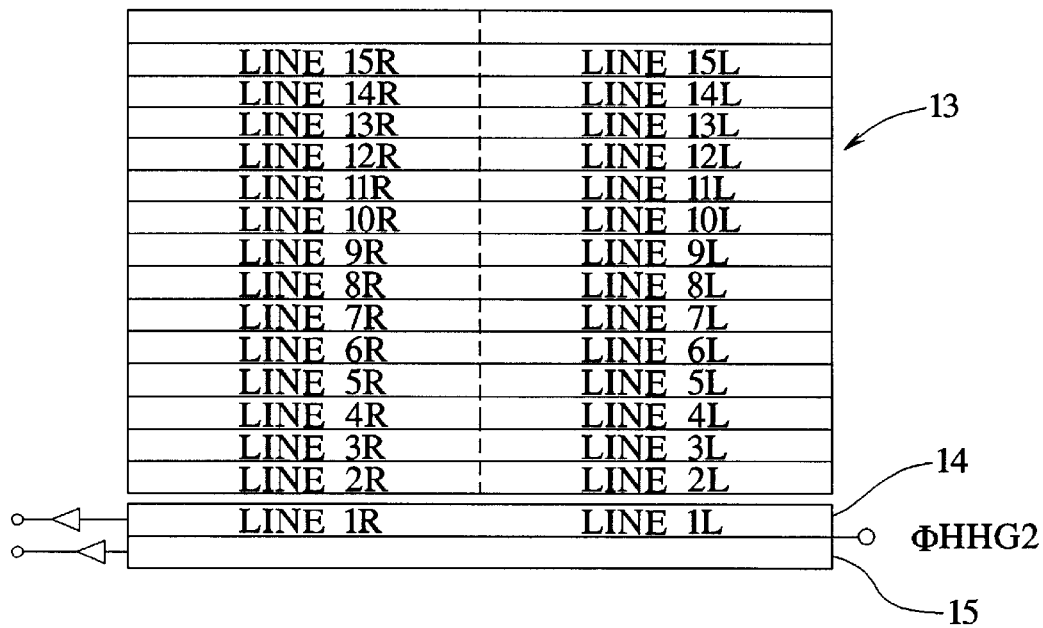

Assuming that the left lower half of the effective pixel area enclosed with a thick line in FIG. 10(A) is the area where the lines 1R to 7R are used, first, the signal charge 1R, 1L on the first line is transferred to the horizontal transfer register 14 as shown in FIG. 10(B). Subsequently, the signal charge 1R, 1L of the first line on the horizontal transfer register 14 is transferred to the horizontal transfer register 15 as shown in FIG. 10(C), and simultaneously the signal charge 2R, 2L of the second line is transferred from the image section 13 to the horizontal transfer register 14.

Figure 10D:
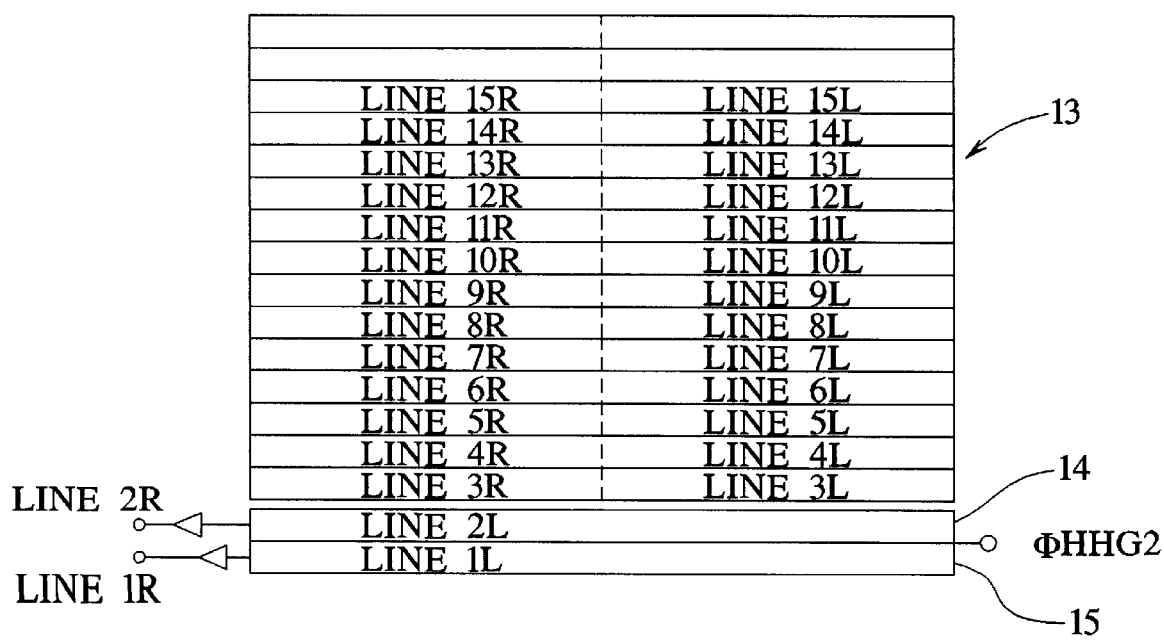

From this condition, the horizontal transfer registers 14 and 15 are driven for horizontally transfer during a half of the normal interval. Thereby, the signal charge 1R, 2R of the first line and second line of the left half of the effective pixel area is output as CCD outputs OUT1 and OUT2. The signal charge 1L of the first line and the signal charge 2L of the second line on the right half of the effective pixel area is residual on the left half of the horizontal transfer registers 15 and 14 as shown in FIG. 10(D).

Figure 11A:
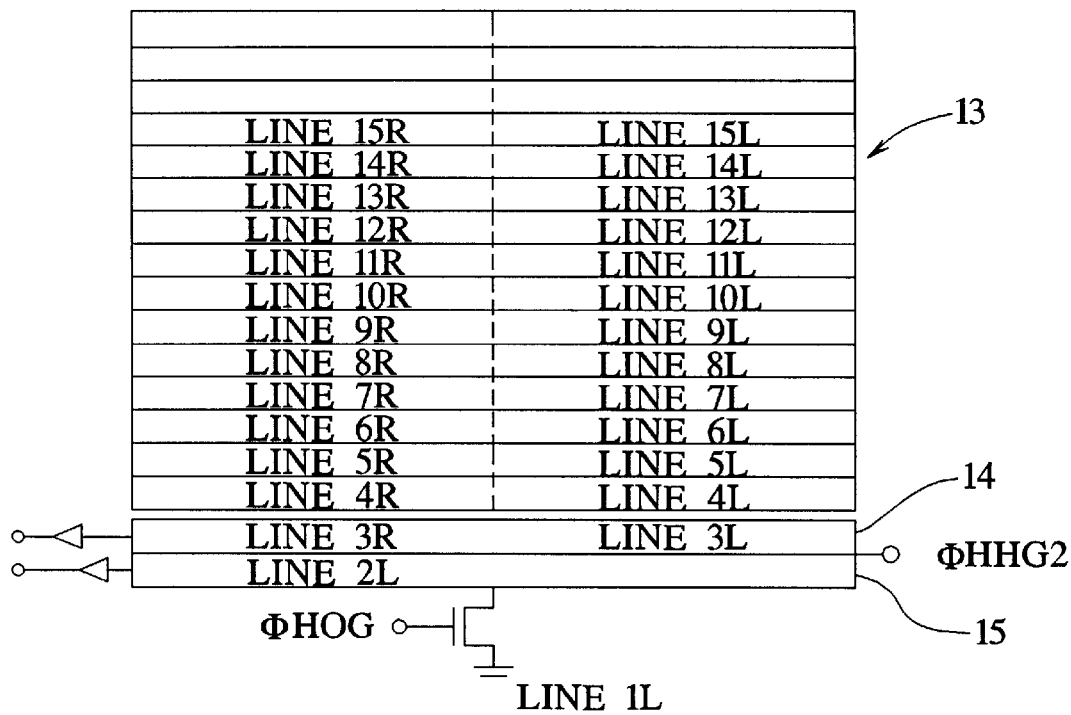
FIGS. 11A–11D are exemplary image diagrams (No. 2) for describing the driving operation of the application example of the present invention.

Next, the respective signal charges 1L, 2L of the first line and the second line remaining residually on the left half of the horizontal transfer registers 14 and 15 are swept out to the charge discharging section 29. In particular, first the signal charge 1L of the first line remaining residually on the horizontal transfer register 15 is swept out to the charge discharging section 29. Then, as shown in FIG. 11(A), the signal charge 2L of the second line remaining residually on the horizontal transfer register 14 is transferred to the horizontal transfer register 15, and the signal charge 3R, 3L of the third line is transferred from the image section 13 to the horizontal transfer register 14.

Figure 11C:
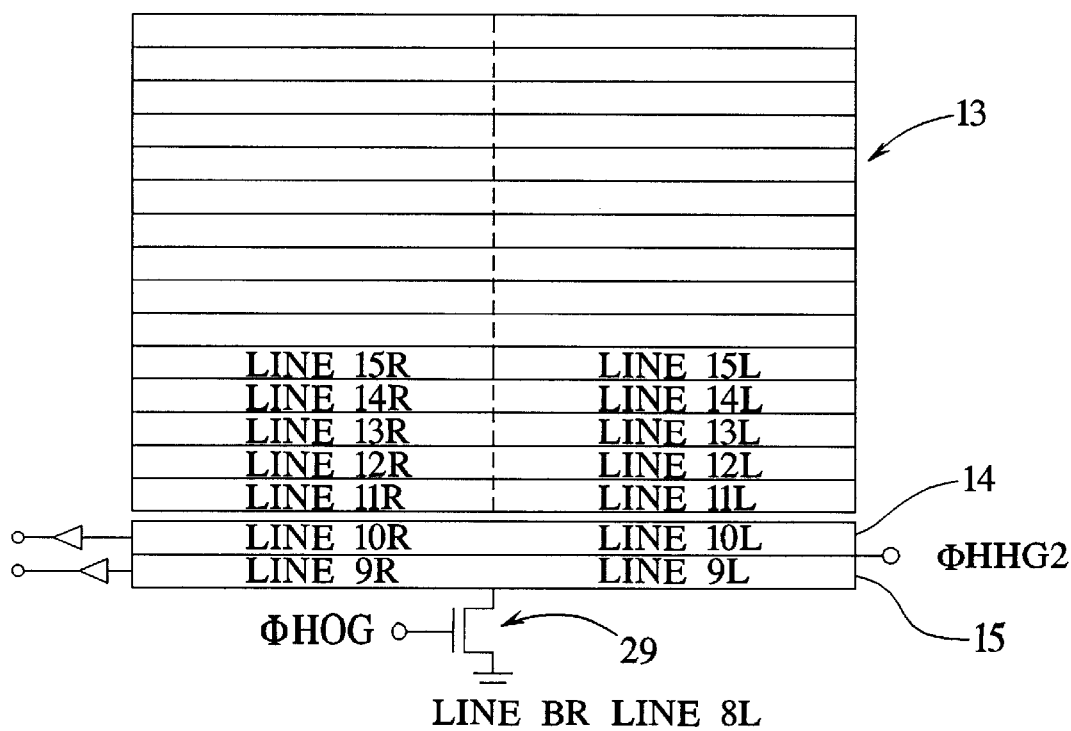
Figure 11B:
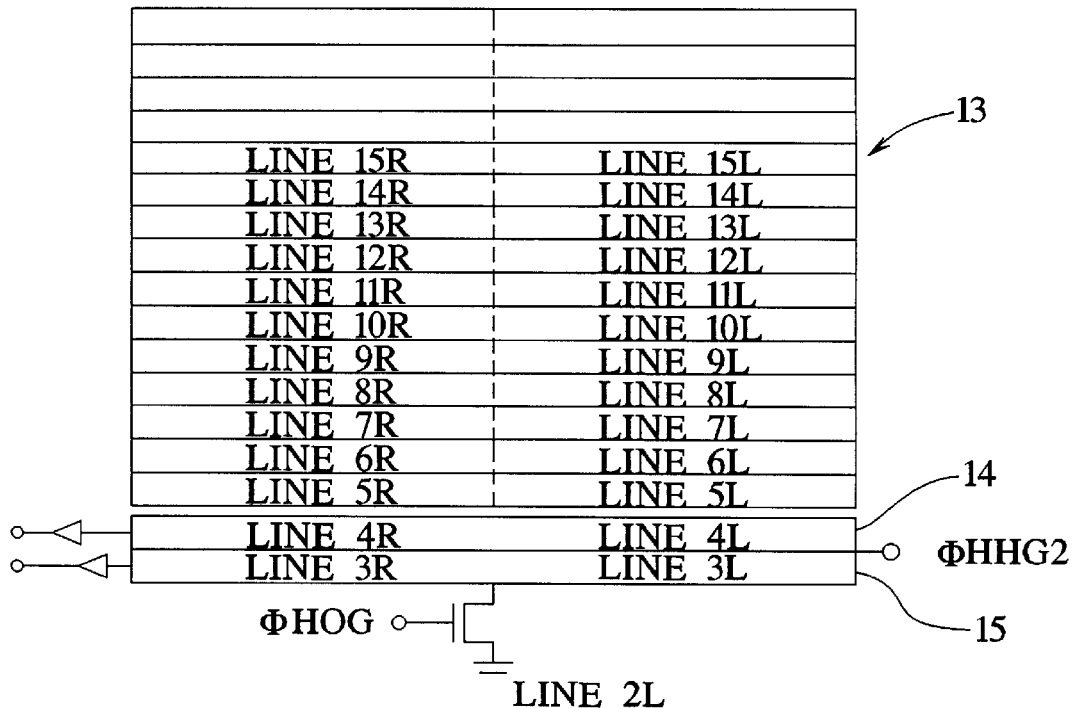

Subsequently, the signal charge 2L of the second line transferred to the horizontal transfer register 15 is swept out to the charge discharging section 29. Then as shown in FIG. 11(B), the signal charge 3R, 3L of the third line of the horizontal transfer register 14 is transferred to the horizontal transfer register 15, and simultaneously to the horizontal transfer register 14, the signal charge 4R, 4L of the fourth line is transferred. Thereafter, the signal charge 3R, 3L of the third line and the signal charge 4R, 4L of the fourth line are read and swept out. By repeating the above-operation up to the seventh line that is the uppermost line in the used area, only the signal charges 1R to 7R in the used area are output as signals.

After completing respective operations of reading and sweeping out of the signal charge in the used area, reading from the signal charge 8R, 8L of the eighth line is not performed, all the signal charges from the signal charge of 8R, 8L to the signal charge of 15R, 15L of the fifteenth line are swept out to the charge discharging section 29. The condition in this process is shown in FIG. 11(C). This figure shows the condition where the signal charge 8R, 8L of the eighth line is swept out to the charge discharging section 29, the signal charge 9R, 9L of the ninth line is transferred to the horizontal transfer register 15, and the signal charge 10R, 10L of the tenth line is transferred to the horizontal transfer register 14.

Figure 11D:
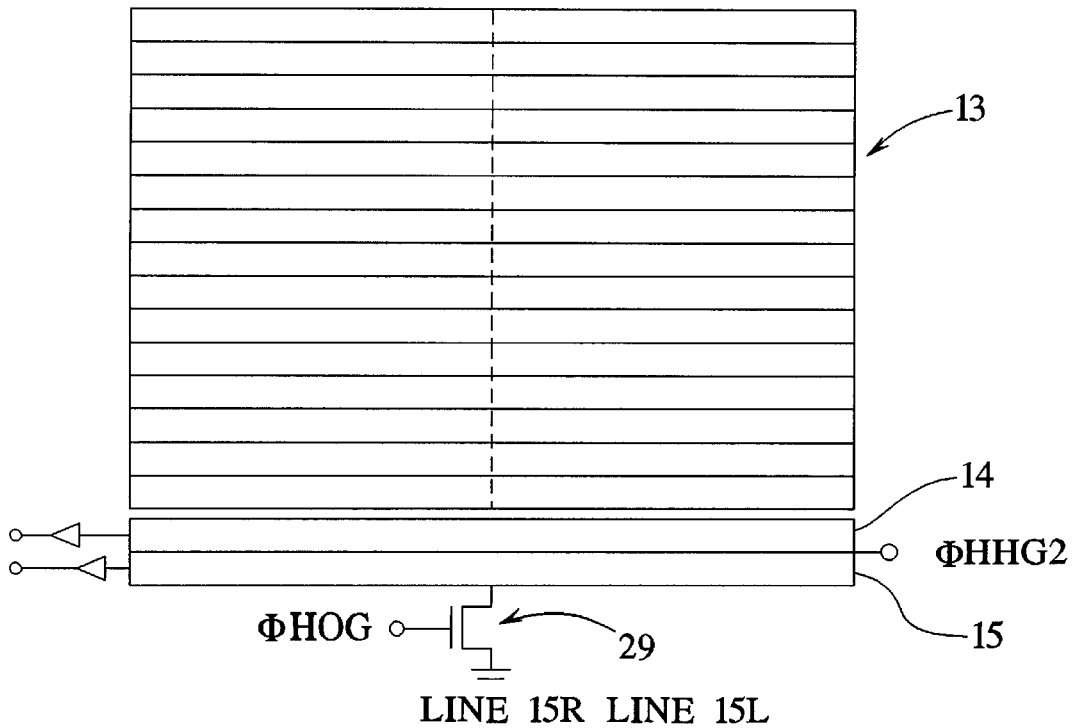
Figure 13:
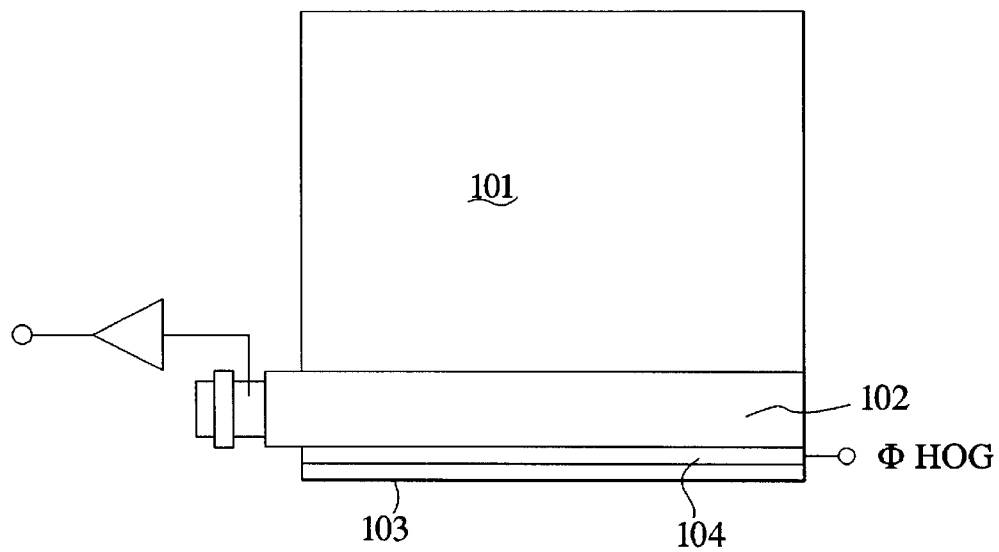
FIG. 13 is a structural diagram for illustrating one conventional example.
Figure 14:
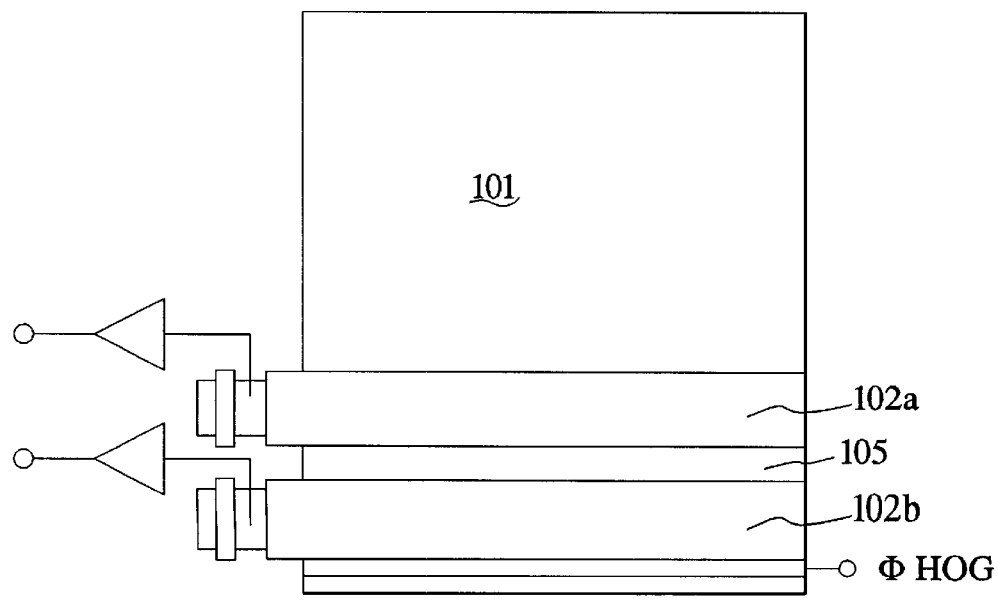
FIG. 14 is a structural diagram for illustrating another conventional example.

When the signal charge 15R, 15L of the fifteenth line is swept out to the charge discharging section 29, reading and sweeping out of the signal charge of all pixels for full one picture are completed as shown in FIG. 11(D). By performing the series of operations described above, the transfer operation of a CCD area sensor can be performed within ¼ of the normal time interval, and the picture rate can be increased by four times. This is the operation that can be only realized by using the horizontal transfer registers 14 and 15 both having the multi-channel structure as described hereinbefore in order to completely transfer the signal charge to the charge discharging section 29.

In the above-mentioned embodiment, the application of a CCD area sensor having two horizontal transfer registers 14 and 15 are described, however, the present invention is by no means limited to this case. The present invention is applied to a CCD area sensor having one horizontal transfer register and having a charge discharging section adjacent to it. In the case of this CCD area sensor, by structuring one horizontal transfer register to 6 multi-channel, if the channel width of the whole horizontal transfer register is widened for the purpose of increasing the charge capacity, the signal charge in the horizontal transfer register (including the signal charge just after the transfer from the image section to the horizontal transfer register) still can be swept out completely and speedily because each channel width of respective transfer channels is still narrow and the transfer electric field in the channel width direction is sufficient.

The present invention is also applied to a CCD area sensor having three or more of horizontal transfer registers in the same way. FIG. 12 is a structural diagram which illustrates the application of the present invention to a CCD area sensor having, for example, three horizontal transfer registers, the same components in the FIG. 12 as in FIG. 1 are provided with the same number as in FIG. 1. In this embodiment, the third horizontal transfer register 31 is provided outside the second horizontal transfer register 15 with interposition of the transfer electrode 30. The charge discharging section 29 is provided adjacent to the out side of the horizontal transfer register 31.

The third horizontal transfer register 31 comprises, for example, two transfer channels 32 and 33 disposed in parallel and a distribution electrode 34 provided between these two transfer channels 32 and 33 for distributing the signal charge to each channel like the horizontal transfer registers 14 and 15. This structure includes the multi-channel structure having the transfer channels 32 and 33 merged at the output. The horizontal transfer register 31 distributes the signal charge for a full one line transferred from the horizontal transfer register 15 through the transfer electrode 30 to two transfer channels 32 and 33 using the distribution electrode 34. The charge transfer is horizontally transferred by way of two transfer channels 32 and 33 in sharing relationship and charges are mixed at the merged output.

At the destination end of the horizontal transfer register 31, a charge detector 35 having, for example, a floating diffusion amplifier structure is provided. The charge detector 35 detects the signal charge transferred through the horizontal transfer register 31 and converts it to a signal voltage. The signal voltage is output as a CCD output OUT3 with two other CCD outputs OUT1 and OUT2 through the amplifier 36.

In the CCD area sensor provided with three horizontal transfer registers 14, 15, and 31 each of which has the multi-channel structure, the respective distribution electrodes 19, 22, and 34 of the horizontal transfer registers 14, 15 and 31 are electrically connected to each other, and driven by the same distribution clock HHG1. The transfer electrodes 16 and 30 provided between the horizontal transfer registers 14, 15, and 31 are also electrically connected each other, and driven by the same transfer clock φHHG2.

As described herein above, in the CCD area sensor having three horizontal transfer registers 14, 15, and 31 provided with the charge discharging section 29 adjacent to the outermost horizontal transfer register 31, by employing the multi-channel structure for all three horizontal transfer registers 14, 15, and 31, the channel width of each transfer channel can be still sufficiently narrow and the transfer electric field in the channel width direction can be sufficient. Therefore the signal charge in the horizontal transfer registers 14, 15, and 31 (including just after the transfer from the image section 13 to the horizontal transfer register 14, transfer to the horizontal transfer register 15 through the horizontal transfer register 14, and transfer to the horizontal transfer register 31 through the horizontal transfer registers 14 and 15) can be swept out completely and speedily.

The respective distribution electrodes 19, 22, and 34 of the horizontal transfer registers 14, 15, and 31 are driven intentionally by the same distribution clock φHHG1, and it is not necessary to differentiate the distribution clock φHHG1 between the respective registers regardless of the increase in the number of the horizontal transfer registers having the multi-channel structure or the number of channels, and the same structure as the driving system is used as it is. Similarly, the use of the same transfer clock φHHG2 for driving the transfer electrodes 16 and 30 between the horizontal transfer registers 14, 15, and 31 eliminates the necessity of the transfer clock φHHG2 change regardless of the number of the horizontal transfer registers, and the same structure as the driving system is used.

In this embodiment, the CCD area sensor having three horizontal transfer registers 14, 15, and 31 is described. However, needless to say, the present invention can be applied in the same manner to a CCD area sensor having four or more horizontal transfer registers and provided with a charge discharging section adjacent to the outermost horizontal transfer register. As described herein above, by employing the structure that uses the same distribution clock φHHG1 for driving all the respective distribution electrodes of the horizontal transfer registers and that uses the same transfer clock φHHG2 for driving all the respective transfer electrodes between the horizontal transfer registers, it is advantageous that there is no need to change the structure of the driving system regardless of the increase in the number of horizontal transfer registers.

As described herein above, according to the present invention, a solid-state image sensing device is provided with at least one charge transfer section for transferring signal charge transferred from the image section and a charge discharging section disposed adjacent to the side of the charge transfer section opposite to the image section. The charge transfer section has a multi-channel structure, thereby each channel of respective transfer channels can be narrow regardless of the channel width of the whole charge transfer section for the purpose of the increasing charge capacity. Signal charge can be swept out to the charge discharging section completely and speedily because the transfer electric field is sufficient for sweeping out the signal charge from the charge transfer section to the charge discharging section.

FIG. 15 is a block diagram illustration of a camera embodying the present invention. The camera is shown generally at reference 201. An optical unit 203 receives light and focuses the incident light on an imaging section 205. The imaging section receives the incident light and a plurality of pixels such as those disclosed with reference to FIG. 1 convert the light to charge. The imaging section is attached to a processing unit 206 which processes the selected or desired pixels as described in more detail above. An operator is able to select high speed processing for a particular portion of the image by depressing a select switch on the camera unit.

Rather than sweeping away the charges into a discharge unit, it has been recognized that the charges can be further transferred into an additional horizontal transfer unit rather than being discharged and lost. FIG. 16 illustrates such a device. In FIG. 16, a secondary horizontal transfer unit 220 is placed adjacent and a transfer electrode which is used to transfer the electric charges from the primary horizontal transfer registers 222 and 223. In a high speed imaging mode, rather than simply sweeping out the undesired portion of signal charges, the signal charges are initially transferred to the secondary horizontal transfer register 220.

It is further recognized that the secondary horizontal transfer register could actually be comprised of one or more secondary horizontal transfer registers depending on the particular design. The secondary horizontal transfer registers feed a further processing unit 227.

The further processing unit 227 includes a charge voltage converter as is known in the art for converting pixel charges to voltages. The voltages may then be either stored in a memory associated with the further processing unit 227 or they may be immediately processed into additional video information.

Advantageously, the further processing unit may operate at a slower speed in order to conserve battery power or to allow the primary processor to more quickly process a desired image portion. Significantly, the image information which is not processed immediately may be later combined with the initially desired image information to provide a composite image. The system identifies which portion of the image has been selected for initial processing and which has been transferred to the secondary image processing unit 227.

Thus, through maintaining this information, the imaging devices are able to later recombine the image information into a composite image.

We claim as our invention:

1. A solid-state image sensing device comprising:

an image section having a plurality of light receivers for photoelectrically converting incident light to a signal charge;

a compound-channel charge transfer section for transferring signal charge of one full line from said image section in sharing relationship with a plurality of parallel transfer channels, a distribution electrode for distributing the signal charge to each of said plurality of transfer channels; and a charge discharging section adjacent to a side of said charge transfer section opposite to said image section for selectively sweeping out signal charge in said charge transfer section, wherein said charge transfer section has a plurality of charge transfer portions and a corresponding plurality of transfer electrodes for transferring the signal charge in units of lines between said plurality of charge transfer portions.

2. The solid-state image sensing device as claimed in claim 1, wherein each of said transfer electrodes of said plurality of charge transfer portions is electrically connected each other and is driven by a same clock.

3. The solid-state image sensing device as claimed in claim 1, wherein three or more said charge transfer portions are provided, and said transfer electrodes provided between each charge transfer portion are electrically connected to each other and driven by the same clock.

4. The solid-state image sensing device as claimed in claim 1, wherein a sweep-out electrode and said transfer electrode are driven by the clock with a same phase.

5. A method for driving a solid-state image sensing device comprising the steps of:

transferring signal charge from an image section to a charge transfer section one line by one line;

sweeping out charge from said charge transfer section to a charge discharging section; further comprising a step of distributing charge from the image section to a plurality of charge transfer portions in units of a line wherein the charge transfer section has a plurality of charge transfer portions and a corresponding plurality of transfer electrodes for transferring the signal charge in units of lines between said plurality of charge transfer portions.

6. The method for driving a solid-state image sensing device as claimed in claim 5, further comprising a step of distributing signal charge to said plurality of transfer channels with a same clock between said plurality of charge transfer portions.

7. The method for driving a solid-state image sensing device as claimed in claim 5, further comprising a step of transferring signal charge between each three charge transfer portions with a same clock.

8. The method for driving a solid-state image sensing device as claimed in claim 5, further comprising a step of sweeping out of signal charge to said charge discharging section and distributing signal charge to said plurality of charge transfer portions with a single clock signal with a same phase.

9. A method of high speed imaging of selected pixels of a CCD imaging device comprising the steps of:

a step of transferring signal charges in a selected line from a image section to a charge transfer section one line by one line and for distributing the signal charges of said line to a plurality of transfer channels in said charge transfer section;

a step of sharing the signal charges of said line with said plurality of transfer channels and transferring only selected charges of the signal charges of said line in said charge transfer section;

a step of sweeping out non-selected charges from said charge transfer section to a charge discharging section;

a step of transferring signal charges of a non-selected line from said image section to said charge transfer section and sweeping out the signal charges of the non-selected line to said charge discharging section.

10. A method of high speed imaging of selected pixels as claimed in claim 9, wherein a first step is a step of transferring signal charges of selected line by line to a plurality of charge transfer portions in said charge transfer section and for distributing the signal charges of each line to said a plurality of transfer channels in each of said charge transfer portions, and last step is a step of transferring signal charges of non-selected lines line by line to each of said a plurality of charge transfer portions in the charge transfer section and sweeping out the signal charges of the non-selected lines to said charge discharging section.

11. The method for driving a solid-state image sensing device as claimed in claim 10, further comprising a step of distributing signal charge to said plurality of transfer channels with a same clock between said plurality of charge transfer portions.

12. The method for driving a solid-state image sensing device as claimed in claim 10, further comprising a step of transferring signal charge between each three charge transfer portions with a same clock.

13. The method for driving a solid-state image sensing device as claimed in claim 10, further comprising a step of sweeping out of signal charge to said charge discharging section and distributing signal charge to said plurality of charge transfer portions with a single clock signal with a same phase.

14. A camera comprising:

a solid state image sensing device having an image section having a plurality of light receivers for photo electrically converting an incident light to a signal charge;

a compound-channel charge transfer section for transferring signal charge of one full line from said image section in sharing relationship with a plurality of transfer channels having said plurality of transfer channels disposed in parallel with each other and a distribution electrode for distributing the signal charges to each of said plurality of transfer channels;

a charge discharging section adjacent to a side of said charge transfer section opposite to said image section for selectively sweeping out signal charge in said charge transfer section; and an optical unit for directing said incident light to said image section of said solid state image sensing device; wherein said charge transfer section has a plurality of charge transfer portions and a corresponding plurality of transfer electrodes for transferring the signal charge in units of lines between said plurality of charge transfer portions.

15. The camera as claimed in claim 14, wherein each of said transfer electrodes of said plurality of charge transfer portions is electrically connected each other and is driven by a same clock.

16. The camera as claimed in claim 14, wherein three or more said charge transfer portions are provided, and said transfer electrodes provided between each charge transfer portion are electrically connected to each other and driven by the same clock.

17. The camera as claimed in claim 14, wherein a sweep-out electrode and said transfer electrode are driven by the clock with a same phase.

18. A camera as claimed in claim 14 having a high-speed imaging mode for processing a selected pixel area.

19. A method of processing video information comprising the steps of:
   generating a plurality of electric charges with a corresponding plurality of pixel elements;
   converting a selected first portion of the plurality of electric charges into video signals at a first rate; and
   processing a second portion of the electric charges at a second rate.

\* \* \* \* \*